(12) United States Patent
Sato

(10) Patent No.: US 7,898,119 B2
(45) Date of Patent: Mar. 1, 2011

(54) PLANAR MOTOR AND STAGE USING THE SAME

(75) Inventor: Mitsuya Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 276 days.

(21) Appl. No.: 12/324,476

(22) Filed: Nov. 26, 2008

(65) Prior Publication Data

US 2009/0140582 A1 Jun. 4, 2009

(30) Foreign Application Priority Data

Nov. 29, 2007 (JP) .............................. 2007-308968

(51) Int. Cl.
*H02K 41/02* (2006.01)
(52) U.S. Cl. .............. 310/12.05; 310/12.06; 310/12.15; 310/12.17; 310/15; 355/53
(58) Field of Classification Search ............. 310/12.05, 310/12.06, 12.15, 12.17, 15; 355/53; *H02K 41/02*
See application file for complete search history.

(56) References Cited

U.S. PATENT DOCUMENTS

| | | | | |
|---|---|---|---|---|
| 3,904,900 A | * | 9/1975 | Shichida et al. | 310/12.05 |
| 3,906,262 A | * | 9/1975 | Shichida et al. | 310/12.05 |
| 4,555,650 A | * | 11/1985 | Asakawa | 318/135 |
| 4,788,477 A | * | 11/1988 | Teramachi | 318/135 |
| 5,760,500 A | * | 6/1998 | Kondo et al. | 310/12.06 |
| 6,703,806 B2 | * | 3/2004 | Joong et al. | 318/649 |
| 6,891,597 B2 | * | 5/2005 | Sekiguchi | 355/53 |
| 7,133,115 B2 | * | 11/2006 | Nawata et al. | 355/53 |
| 2002/0018195 A1 | * | 2/2002 | Iwamoto et al. | 355/72 |
| 2009/0140582 A1 | * | 6/2009 | Sato | 310/12 |

FOREIGN PATENT DOCUMENTS

JP 07-059332 A 3/1995

* cited by examiner

*Primary Examiner*—Quyen Leung
*Assistant Examiner*—John K Kim
(74) *Attorney, Agent, or Firm*—Canon U.S.A., Inc. I.P. Division

(57) ABSTRACT

A planar motor includes a movable body and a stator configured to drive the movable body in a plane. The stator includes a first stator unit and a second stator unit. The movable body is moved in a first direction by a force acting between the movable body and the first stator unit, and is moved in a second direction by a force acting between the movable body and the second stator unit. The first stator unit and the second stator unit are arranged to face each other in such a manner that the movable body is provided therebetween.

10 Claims, 9 Drawing Sheets

PLANAR MOTOR AND STAGE USING THE SAME

BACKGROUND OF THE INVENTION

1. Field of the Invention

The present invention relates to a planar motor and a stage using the planar motor.

2. Description of the Related Art

A planar pulse motor serving as an example of a planar motor will be described below as background art.

FIGS. 8A to 8D show the principle of operation of a linear pulse motor as a related art. The linear pulse motor includes a platen 201 serving as a stator formed of a magnetic material. The platen 201 has periodic projections on a major surface thereof, that is, includes platen projections 202 and platen depressions 203. Teeth 204 are provided in a movable body, and are magnetized by current from coils 205 and 206. Attraction force is generated between the movable body teeth 204 and the platen 201 by permanent magnets 207 and 208. Reference numerals 209 and 210 denote magnetic flux generated by the permanent magnets 207 and 208 and magnetic flux generated by the coil current, respectively. Magnetic attraction force is generated at tooth groups 211 to 214 by the coils 205 and 206.

In this linear pulse motor, the platen projections 202 are arranged at a fixed interval τ on the platen 201. FIGS. 8A to 8D respectively show the states in which the movable body is at an original position, a τ/4 position, a 2τ/4 position, and a 3τ/4 position. The tooth groups 211 to 214 are spatially shifted from one another by τ/4. For this reason, when current is passed through the coil 205 in a direction shown in FIG. 8A at the original position, magnetic flux passing through the tooth group 211 is maximized by combination with magnetic flux of the permanent magnet 207. Consequently, a force for moving the entire movable body to the left is generated, and the movable body is moved to the τ/4 position shown in FIG. 8B.

By similarly passing current through the coils 205 and 206 in the directions shown in FIGS. 8B to 8D, the movable body can be sequentially moved to the left.

FIG. 9 shows movable bodies in the planar pulse motor. Referring to FIG. 9, a movable stage 215 is movable in the X and Y directions, and is levitated by air ejected from air outlets 216. In the movable stage 215, two single-axis movable bodies shown in FIG. 8 are provided for each of the X and Y directions so as to allow driving in the X and Y directions.

FIG. 10 is a general view of the planar pulse motor as the related art. The movable stage 215 is levitated by air above the platen 201 with a gap of about 20 micrometers therebetween. The movable stage 215 can be driven in the X and Y directions according to the above-described driving principle.

In the planar pulse motor, however, square platen projections 202 are periodically arranged on the platen 201. For this reason, from the viewpoint of the movable-body tooth groups, the utilization efficiency of magnetic flux is about 50%. Therefore, it is difficult to increase the thrust in the planar pulse motor.

Japanese Patent Laid-Open No. 7-59332 presents the following proposal for increasing the thrust of the planar pulse motor. That is, a single-axis linear pulse motor that is movable in the X-axis direction is provided on a front side of a platen. Further, a single-axis linear pulse motor that is movable in the Y-axis direction is provided on a back side of the platen. The two linear pulse motors provided on the front and back sides are connected by a long arm, thus forming an XY planar motor.

Unfortunately, in the above proposal, at least a moving space of the arm, which is equal to the moving stroke of the stage, is required on each side of the platen. Therefore, it is difficult to realize a compact stage. Moreover, the arm needs to have sufficient rigidity to ensure high stage accuracy. It is considered that there is a need to increase the weight to ensure such a high rigidity. As a result, it is difficult to increase the thrust.

SUMMARY OF THE INVENTION

The present invention provides a compact and light stage that can increase the thrust.

A planar motor according to an embodiment of the present invention includes a movable body and a stator. The stator includes a first stator unit and a second stator unit. The movable body is moved in a first direction by a force acting between the movable body and the first stator unit, and is moved in a second direction by a force acting between the movable body and the second stator unit. The first stator unit and the second stator unit are arranged to face each other in such a manner that the movable body is provided therebetween.

Further features of the present invention will become apparent from the following description of exemplary embodiments with reference to the attached drawings.

DESCRIPTION OF THE EMBODIMENTS

According to the present invention, linear-motor stators for generating thrust or receiving thrust in an X-direction and a Y-direction are respectively provided above and below a movable body that can move in an XY plane in X and Y directions. With this simple structure, a thrust equivalent to a thrust generated by a single-axis linear motor can be obtained in both the X and Y directions.

Moreover, since an arm is unnecessary, there is no need to provide a moving space for the arm. This can realize a more compact stage.

First Embodiment

Figure 1A:
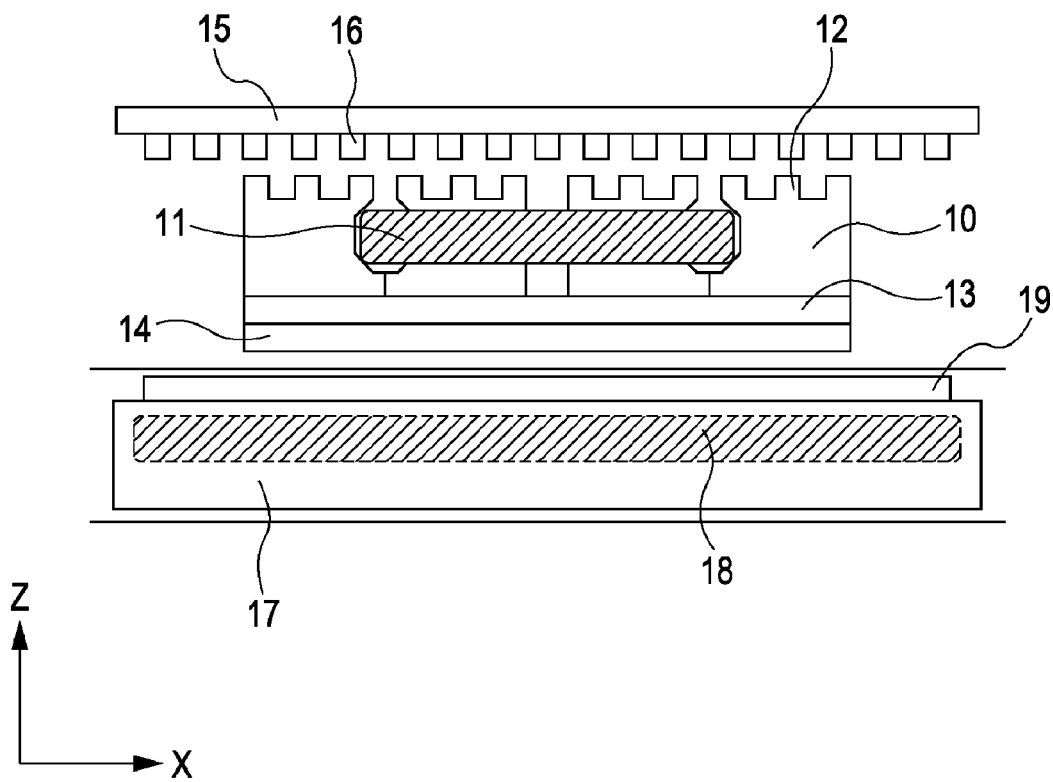
FIGS. 1A and 1B are explanatory views of a stage according to a first embodiment.
Figure 1B:
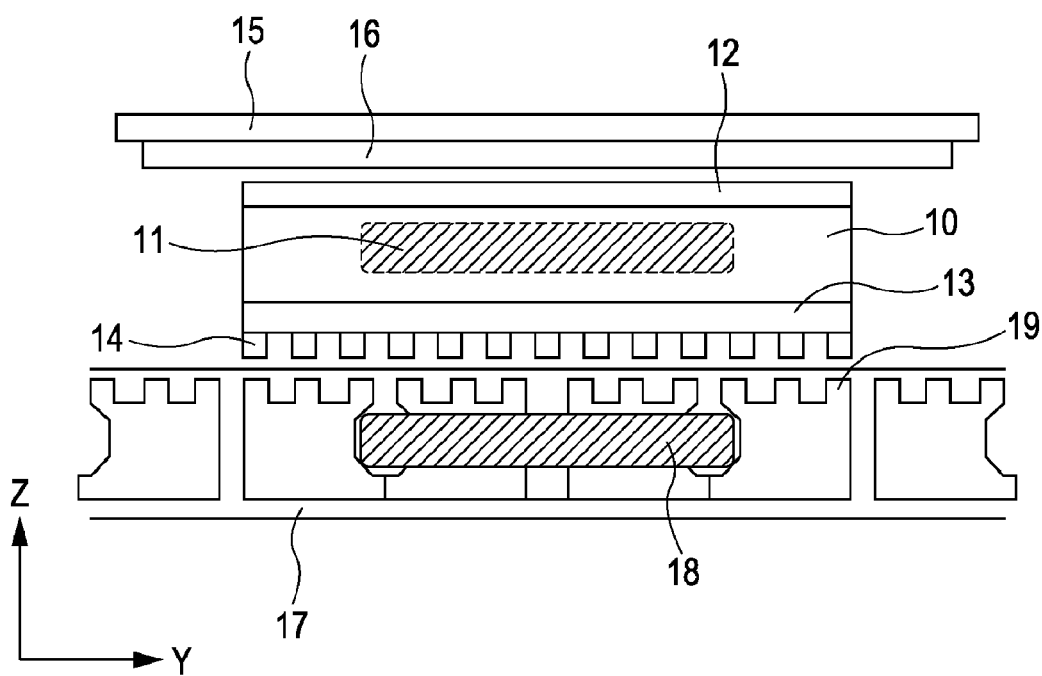

FIGS. 1A and 1B are side views of a planar motor according to a first embodiment of the present invention.

The planar motor according to the first embodiment includes a movable body 10, a fixed platen 15 serving as a stator for driving the movable body 10 in the X-direction, and a fixed portion 17 for driving the movable body 10 in the Y-direction. The movable body 10 includes a movable coil 11 and movable-coil teeth 12 for X-direction driving of the movable body 10, and a movable platen 13 for Y-direction driving of the movable body 10. Movable-platen projections 14 are provided on the movable platen 13, and fixed-platen projections 16 are provided on the fixed platen 15. The fixed portion 17 includes a fixed coil 18 and fixed coil teeth 19 for Y-direction driving.

Referring to FIGS. 1A and 1B, the fixed platen 15 serving as the stator for driving the movable body 10 in the X-direction faces the fixed portion 17 with the movable body 10 disposed therebetween.

Driving in the X-direction (first direction) is performed by a magnetic force that acts between the movable coil teeth 12 and the fixed-platen projections 16 facing the teeth when current is supplied to the movable coil 11 provided in the movable body 10.

A first driving unit includes the movable coil 11 and the movable coil teeth 12. A first stator includes the fixed-platen projections 16 provided on the fixed platen 15. The first driving unit and the first stator constitute a linear pulse motor for driving the movable body 10 in the X-direction.

Driving in the Y-direction (second direction) is performed by a magnetic force that acts between the fixed-coil teeth 19 and the movable platen 13 provided in the movable body 10 when current is supplied to the fixed coil 18 provided in the fixed portion 17.

A second driving unit includes the movable-platen projections 14 provided on the movable platen 13. A second stator includes the fixed coil 18 and the fixed-coil teeth 19 provided in the fixed portion 17. The second driving unit and the second stator constitute a linear pulse motor for driving the movable body 10 in the Y-direction.

As described above, the linear pulse motor for driving the movable body 10 in the X-direction is provided on the upper side of the movable body 10, and the linear pulse motor for driving the movable body 10 in the Y-direction is provided on the lower side of the movable body 10. This allows the movable body 10 to be driven in the X and Y directions (in a plane, such as for example the horizontal plane).

The linear pulse motors for driving the movable body 10 in the X and Y directions may have a known structure that has been described as the related art. It is satisfactory as long as the following conditions are satisfied. That is, the movable body 10 has, on the upper and lower sides, teeth or projections for driving in the X and Y directions, the stators are arranged so as to sandwich the movable body 10, and the linear pulse motors for driving the movable body 10 in the X and Y directions are provided on either side of the movable body 10.

Which of the driving unit and the stator is formed by a platen and which of them is provided with a coil are not limited by the structures adopted in the first embodiment. For example, the first stator and the second stator can be provided with coils, and the first driving unit and the second driving unit can be formed by platens.

When the first direction is the X-direction and the second direction is the Y-direction, as in the first embodiment, the first stator serves as a stator for X-direction driving and the second stator serves as a stator for Y-direction driving. However, the first direction and the second direction are exemplarily given in the first embodiment, and the directions are not limited thereto.

Unlike the planar motor as the related art in which the movable body is driven in the X and Y directions by the single stator, the movable body is driven in the XY plane by the stator for X-direction driving and the stator for Y-direction driving in the first embodiment. With this structure, the area of the stator that can be used to drive the movable body is increased in both the X-direction and the Y-direction. Therefore, the thrust can be increased when driving the movable body, compared with the related art. When the movable body is not driven in the X-axis direction and the Y-axis direction (for example, when the movable body is driven in a direction at an angle of 45° to the X-axis direction), the thrust is increased more markedly than in the related art.

Second Embodiment

A semiconductor exposure apparatus having two stages to which the present invention is applied will be described below as a second embodiment.

The semiconductor exposure apparatus includes an AA (auto alignment) area where the position of a pattern on a wafer (not shown) on a stage relative to the wafer is measured, and an Expo (exposure) area where exposure is performed. Two stages are provided to perform measurement and exposure in the above-described two areas. In the semiconductor exposure apparatus, when measurement for a stage in the AA area is completed, the stage is moved to the Expo area, and is subjected to exposure. The two stages are sequentially placed in the AA area and the Expo area so that measurement and exposure can be performed concurrently.

The semiconductor exposure apparatus will be described below with a focus on a stage section.

Figure 2A:
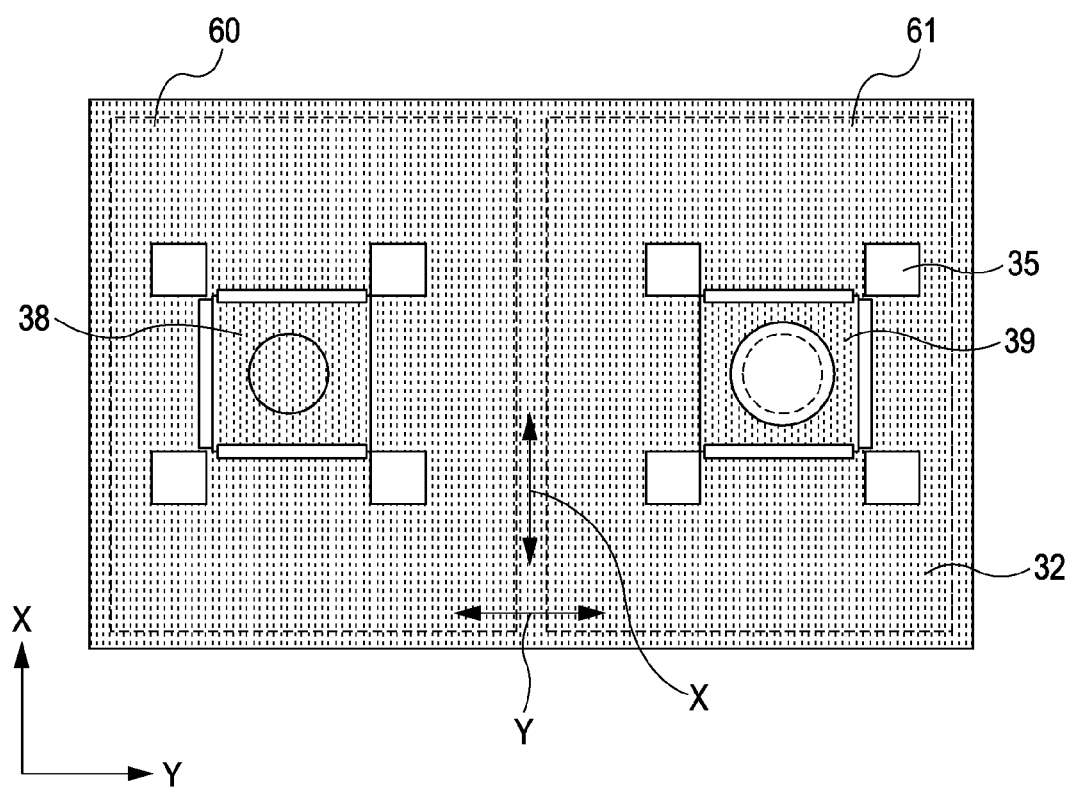
FIGS. 2A to 2D are explanatory views of a stage according to a second embodiment (a back surface of an X-direction stationary platen).
Figure 2B:
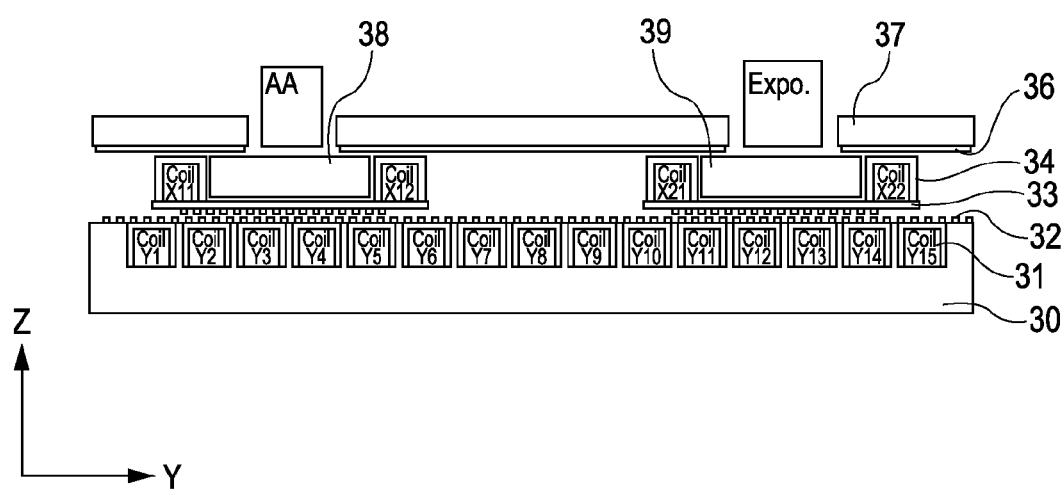

FIGS. 2A to 2D show a planar motor in a semiconductor exposure apparatus according to the second embodiment. FIG. 2A is a top view of movable stages 38 and 39 and fixed-coil teeth 32 provided therebelow so as to drive the movable stages 38 and 39 in the Y-direction. While an AA area 60 and an Expo area 61 enclosed by dotted lines are exemplarily shown in FIG. 2A, they do not always need to be strictly limited to the illustrated regions. It is satisfactory as long as the area for measuring the pattern position on the wafer and the area for exposure are provided somewhere on the planar motor. FIG. 2B is a side view of the planar motor according to the second embodiment. As shown in FIG. 2, for Y-direction (second direction) driving, fixed coils 31 are fixed to a stage surface plate 30, and movable platens 33 are provided movably. On the movable platens 33, movable coils 34, movable coil teeth 35, etc. for generating thrust in the X-direction (first direction) are provided. A fixed platen 36 serving as a stator for X-direction driving is provided above the movable stages 38 and 39.

Figure 10:
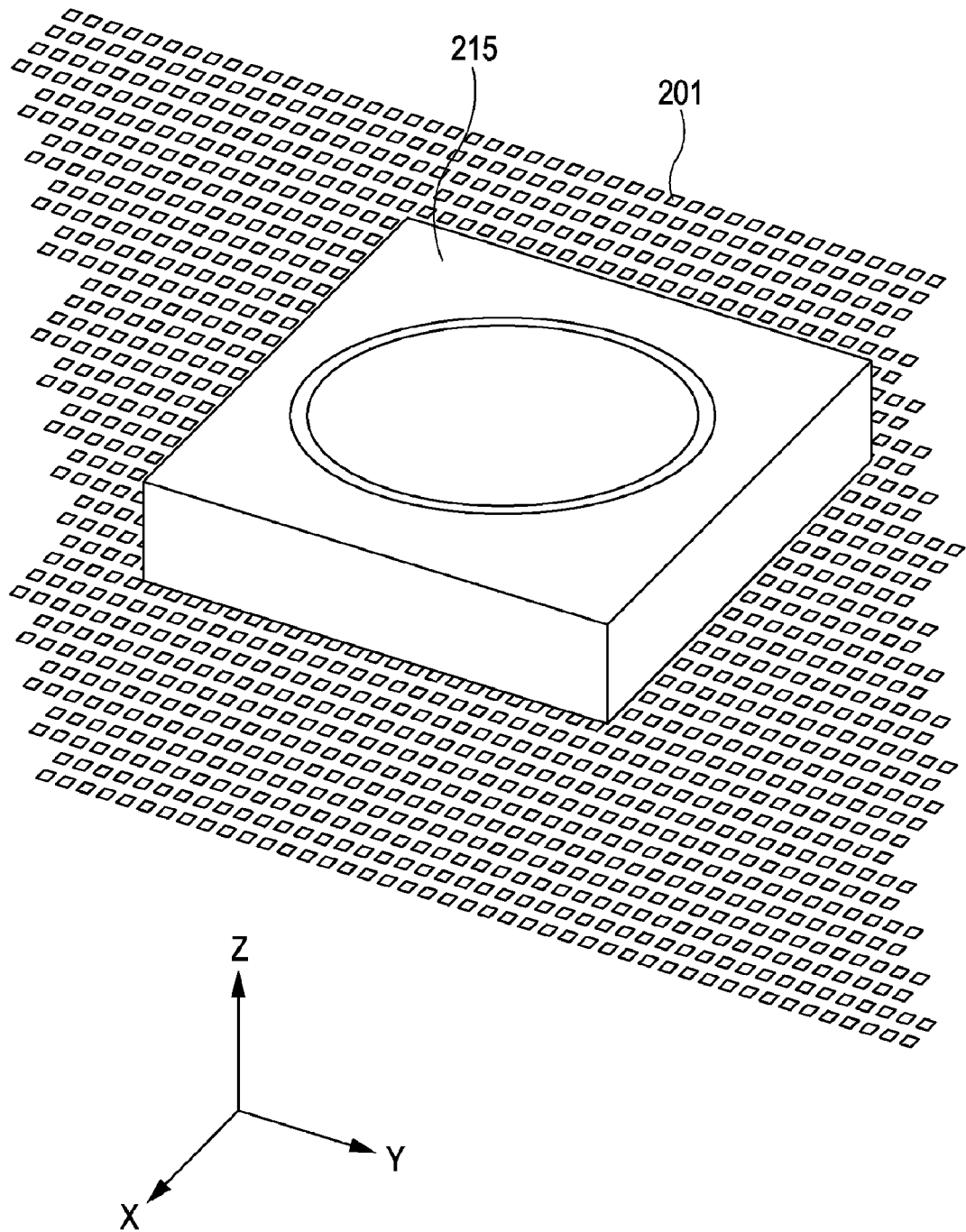
FIG. 10 is a general view of the known planar pulse motor.

Compared with the planar pulse motor as the related art shown in FIG. 10, in the second embodiment, the platen provided below the movable stages 38 and 39 can be used only for Y-axis direction driving, and the utilization efficiency of magnetic flux of the driving coils can be increased markedly.

Since the fixed coils 31 for generating thrust in the Y-direction are provided on the fixed side, the weight of the movable platens 33 moving in the Y-direction can be reduced, and the thrust in the Y-direction can be increased.

Similarly, the movable stages 38 and 39 are provided on the lower side of a top plate 37 at the top of the surface stage, and face the movable coils 34 and the movable coil teeth 35. Since the fixed platen 36 is used only for X-axis driving, the utilization efficiency of magnetic flux of the driving coils can be improved markedly.

Since the single-axis linear motors are thus respectively provided for X-direction driving and Y-direction driving in the second embodiment, control can be simplified.

Figure 2C:
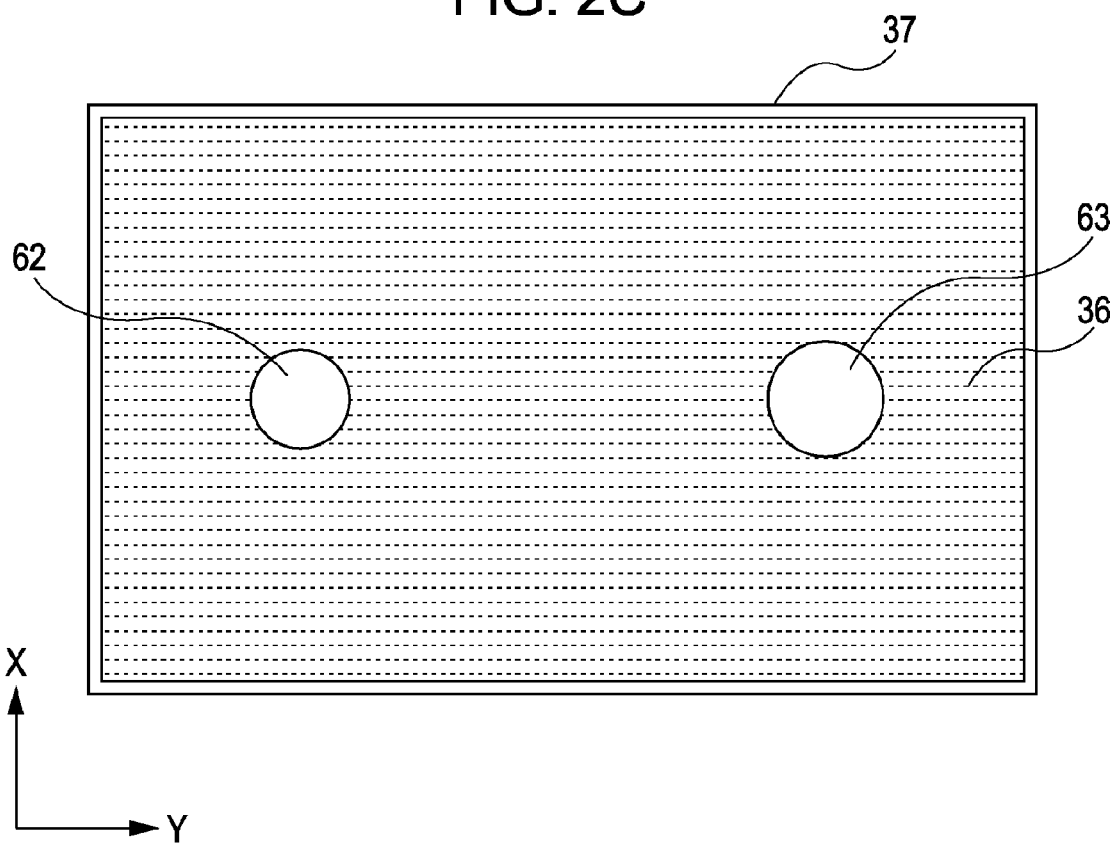

FIG. 2C shows the top plate 37 and the fixed platen 36 in the planar motor of the semiconductor exposure apparatus, as viewed from the movable stages 38 and 39. As shown in FIG. 2C, the top plate 37 has openings 62 and 63 through which measurement and exposure are performed. When performing measurement and exposure, a wafer or the like is irradiated with light through the openings 62 and 63.

Figure 2D:
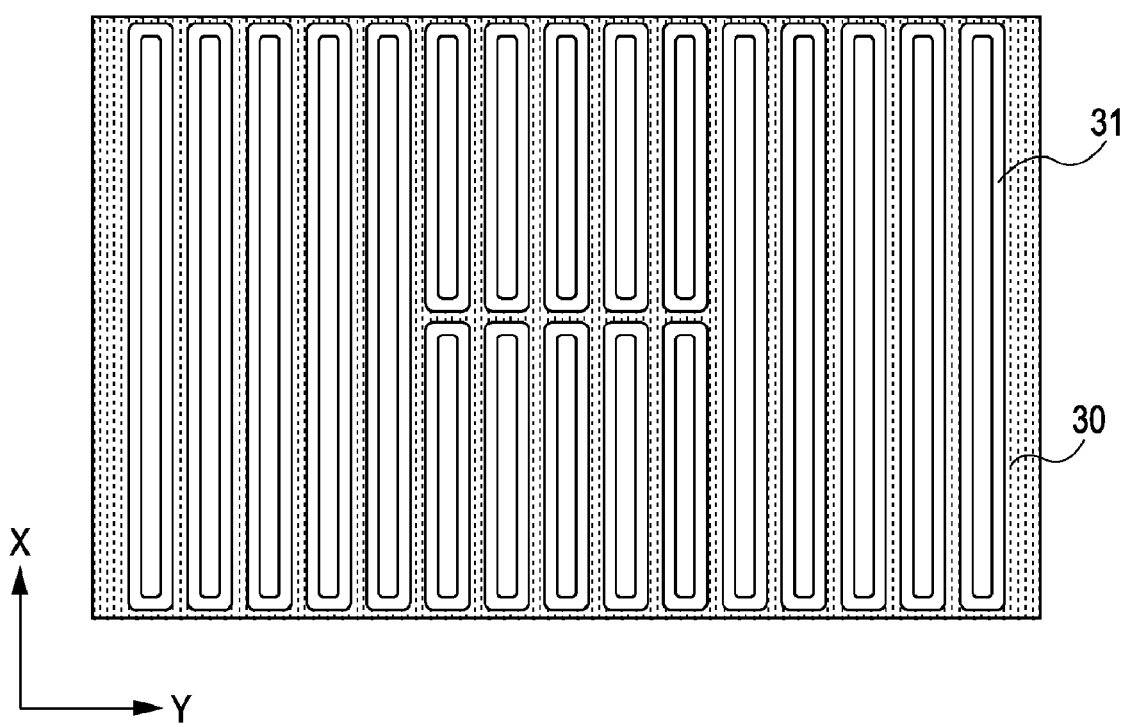

The fixed coils 31 in the planar motor are provided in the stage surface plate 30 at the bottom of the planar stage, as shown in FIG. 2D. A pipe (not shown) through which liquid for cooling flows is provided around the fixed coils 31 so as to cope with heat generation.

In the semiconductor exposure apparatus of the second embodiment, the two movable stages 38 and 39 need to change places with each other between the AA area and the Expo area. For this reason, fixed coils 31 at the center are divided in two so that the two movable stages 38 and 39 can be independently driven in the Y-direction during exchange, as shown in FIG. 2D.

While the above-described semiconductor exposure apparatus of the second embodiment has two stages, the present invention is also applicable to an apparatus having one stage or an apparatus having three or more stages.

While the planar motor according to the present invention is applied to the semiconductor exposure apparatus in the second embodiment, the present invention is also applicable to various other apparatuses using a planar motor.

While the semiconductor exposure apparatus to which the planar motor of the present invention is applied has been briefly described above, modifications of the second embodiment will be described below with reference to FIGS. 4 to 6.

Figure 3:
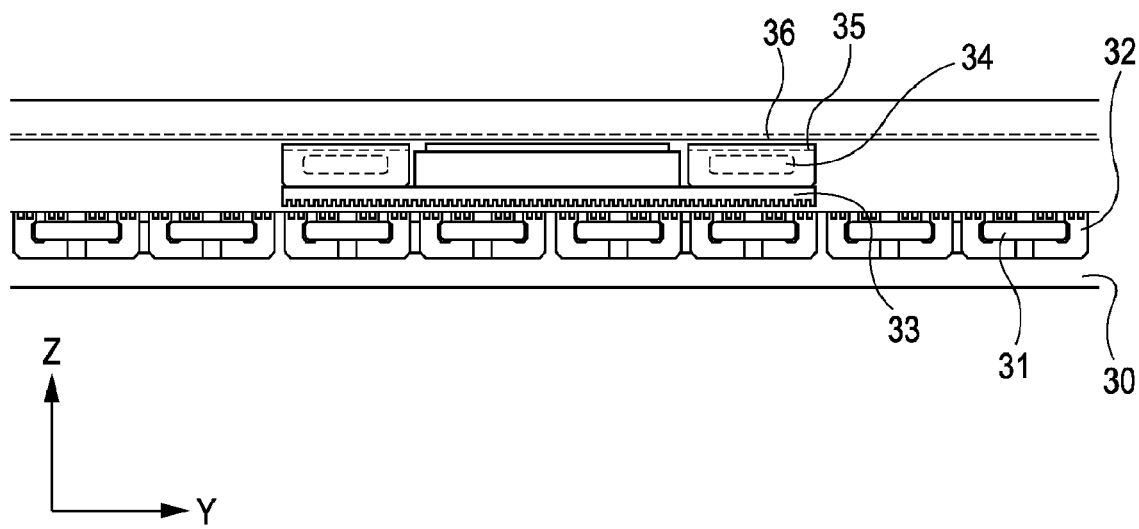
FIG. 3 is a view of the stage of the second embodiment.
Figure 4:
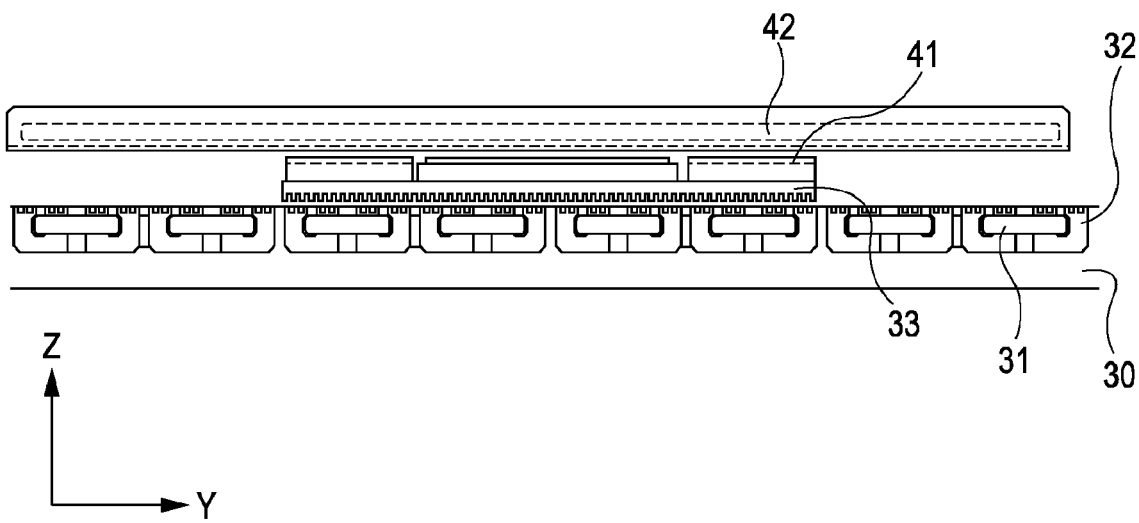
FIG. 4 is an explanatory view of a first modification of the stage of the second embodiment.
Figure 5:
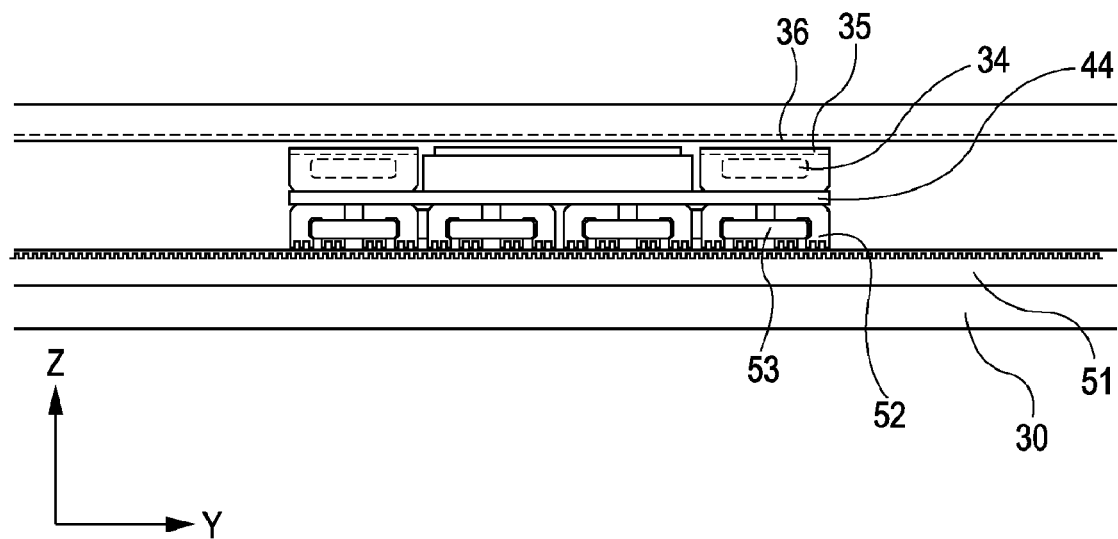
FIG. 5 is an explanatory view of a second modification of the stage of the second embodiment.
Figure 6:
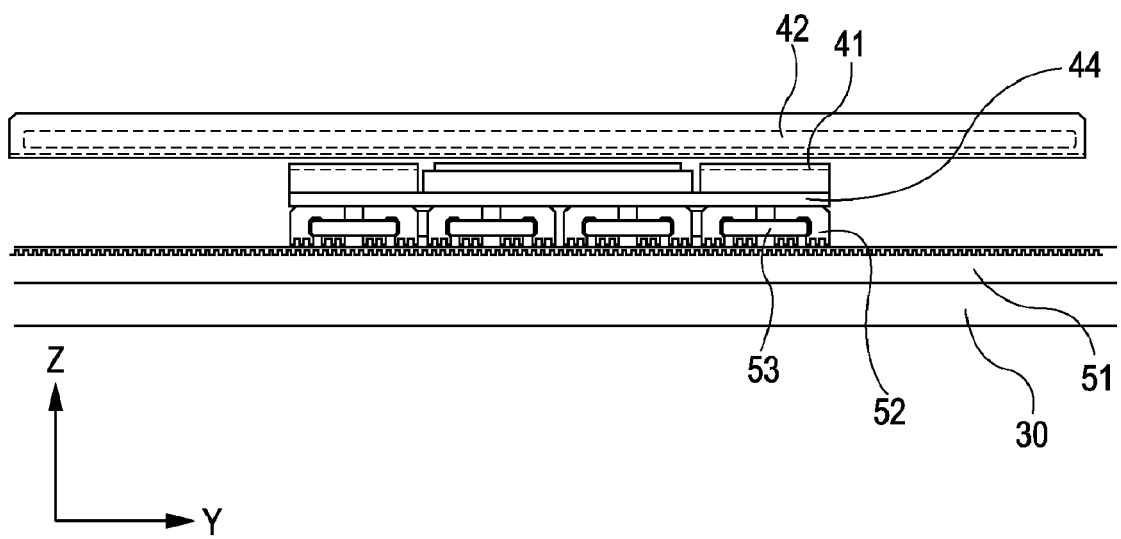
FIG. 6 is an explanatory view of a third modification of the stage of the second embodiment.

FIG. 3 shows the second embodiment for comparison with modifications shown in FIGS. 4 to 6. In the embodiment shown in FIG. 3, a movable platen method is adopted for Y-direction driving, and a movable coil method is adopted for X-direction direction. FIG. 3 is an enlarged view so as to facilitate descriptions of the following modifications.

A linear pulse motor for driving a stage in the X-direction is constituted by a first driving unit including movable coils 34, movable coil teeth 35, and a fixed platen serving as a first stator. A linear pulse motor for driving a stage in the Y-direction is constituted by a movable platen serving as a second driving unit and a second stator including fixed coils 31 and fixed coil teeth 32.

As shown in FIG. 3, the first stator and the second stator face each other.

FIG. 4 shows a first modification of the second embodiment. In the first modification, a movable platen method is adopted for both Y-direction driving and X-direction driving.

A linear pulse motor for driving a stage in the X-direction is constituted by a movable platen 41 serving as a first driving unit and a first stator including fixed coils 42 and fixed coil teeth (not shown). A linear pulse motor for driving a stage in the Y-direction is constituted by a movable platen serving as a second driving unit and a second stator including fixed coils 31 and fixed coil teeth 32.

In the first modification, the movable stage does not need coils, and therefore, it can be reduced in weight and thickness. Moreover, since all coils (fixed coils 42 and fixed coils 31) can be placed on the fixed side, wiring from the fixed side to the coils of the motor is unnecessary, wire mounting can be minimized, and cooling of the coils is facilitated.

FIG. 5 shows a second modification of the second embodiment. In the second modification, a movable coil method is adopted for both Y-direction driving and X-direction driving.

In the second modification, a linear pulse motor for driving a stage in the X-direction is constituted by a first driving unit including movable coils 34 and movable coil teeth 35, and an X fixed platen 36 serving as a first stator. A linear pulse motor for driving a stage in the Y-direction is constituted by a second driving unit including movable coils 53 and movable coil teeth 52, and a Y fixed platen 51 serving as a second stator.

Since the stators do not need to have coils, they can be simplified. The second modification is advantageous particularly when a plurality of movable stages are provided, because there is no need to complicatedly divide the fixed coils and to perform complicated control.

Since only the fixed platen 36 is provided above the stage, design constraint on operation units, such as an exposure unit and a measuring unit, provided above the stage is less than in the first modification. However, since both coil units for Y-direction driving and X-direction driving need to be mounted in the movable body, the weight of the movable body increases. For this reason, the second modification can provide double the thrust of the planar pulse motor as the related art, but it is slightly inferior to the other modifications in thrust.

FIG. 6 shows a third modification. In the third modification, a movable coil method is adopted for Y-direction driving, and a movable platen method is adopted for X driving. This arrangement of the movable coil and the movable platen is reverse to that adopted in the second embodiment shown in FIG. 3.

A linear pulse motor for driving a stage in the X-direction is constituted by a movable platen 41 serving as a first driving unit, and a first stator including fixed coils 42 and fixed coil teeth (not shown). A linear pulse motor for driving a stage in the Y-direction is constituted by a second driving unit including movable coils 53 and movable coil teeth 52, and a fixed platen 51 serving as a second stator.

Third Embodiment

Figure 7:
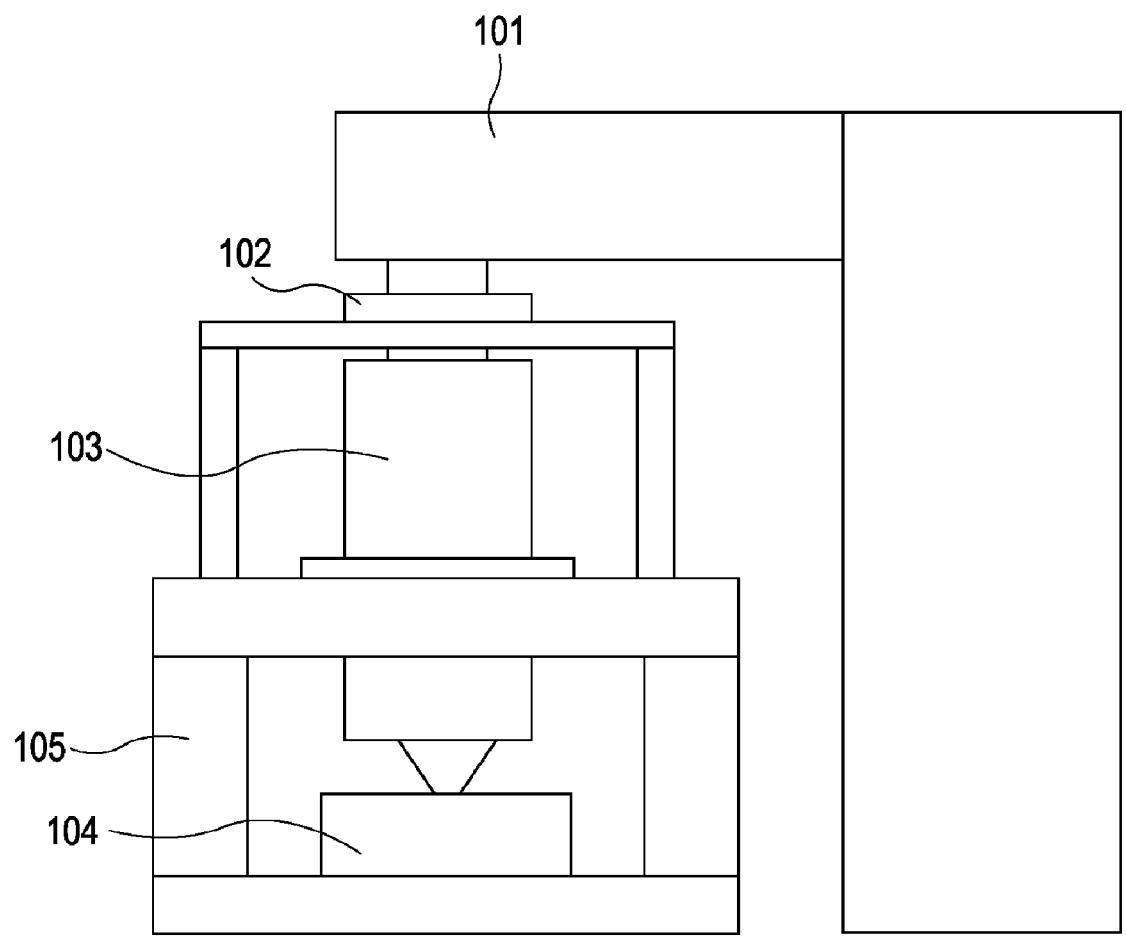
FIG. 7 illustrates an exposure apparatus.
Figure 8A:
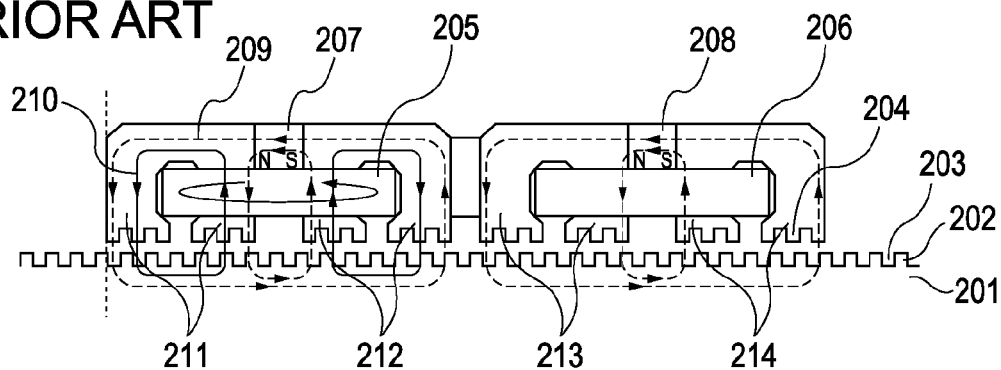
FIGS. 8A to 8D show the principle of operation of a known planar pulse motor as the related art.
Figure 8B:
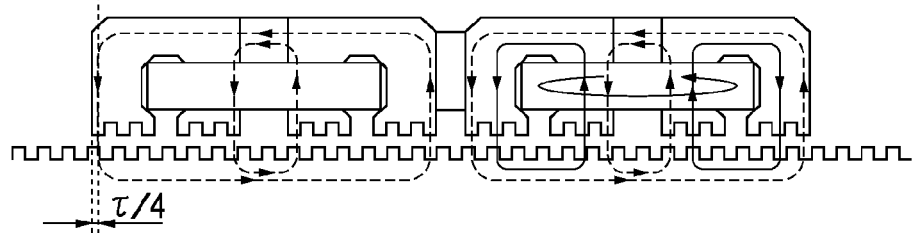
Figure 8C:
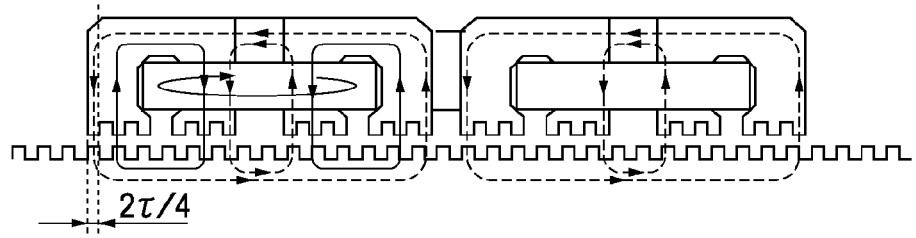
Figure 8D:
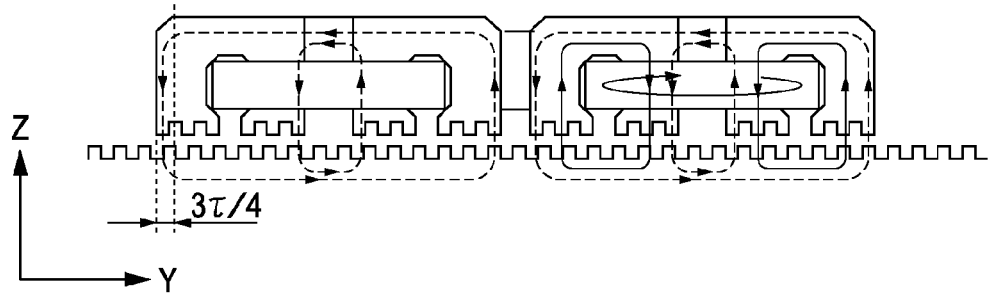
Figure 9:
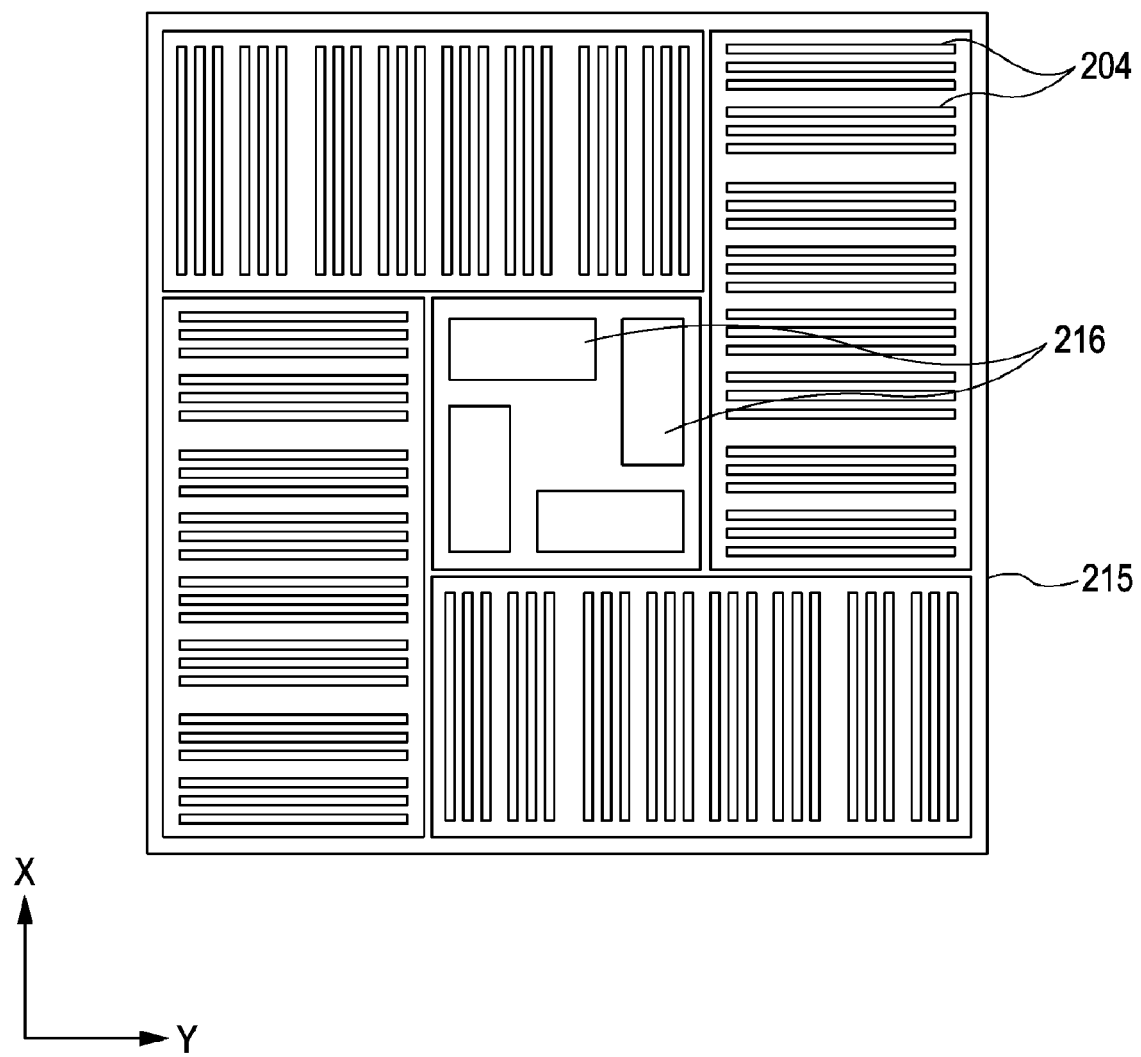
FIG. 9 shows movable bodies in a known planar pulse motor.

An example of an exposure apparatus to which a stage device of the present invention is applied will be described below. Referring to FIG. 7, an exposure apparatus 105 includes an illumination device 101, a reticle stage 102 on which a reticle is mounted, a projection optical system 103, and a wafer stage 104 on which a wafer is mounted. The exposure apparatus 105 projects a circuit pattern provided on a reticle onto a wafer by exposure, and can adopt a step-and-repeat projection exposure method or a step-and-scan projection exposure method.

The illumination device 101 illuminates a reticle having a circuit pattern, and includes a light source unit and an illumination optical system. For example, the light source unit uses a laser as a light source. As the laser, for example, an ArF excimer laser with a wavelength of about 193 nm, a KrF excimer laser with a wavelength of about 248 nm, or an F2 excimer laser with a wavelength of about 157 nm can be used. However, the type of the laser is not limited to an excimer laser, and may be, for example, a YAG laser. Also, the number of lasers is not limited. When a laser is used as the light source, it is preferable to use a light flux shaping optical system for shaping a parallel light beam from the light source in a desired beam form and an incoherent optical system for converting a coherent laser light beam into an incoherent light beam. The light source used in the light source unit is not limited to a laser, and one or a plurality of lamps, such as mercury lamps or xenon lamps, can be used. Further, the light source can use EUV (extreme ultraviolet) rays. Still further, electron beams can be used instead of the light source.

The illumination optical system illuminates a mask, and includes a lens, a mirror, a light integrator, an aperture stop, etc.

The projection optical system 103 can be formed by the following optical systems, that is, an optical system including only a plurality of lens elements, an optical system including a plurality of lens elements and at least one concave mirror (catadioptric optical system), an optical system including a plurality of lens elements and at least one diffraction optical element, such as a kinoform, and an optical system including only mirrors.

The reticle stage 102 and the wafer stage 104 can be moved by, for example, a linear motor. In a step-and-scan projection exposure method, the stages 102 and 104 are moved synchronously. Further, an actuator is provided in at least one of the reticle stage 102 and the wafer stage 104 in order to align the pattern on the reticle with the wafer.

This exposure apparatus can be used to manufacture semiconductor devices, such as semiconductor integrated circuits, micromachines, and devices having a fine pattern, such as thin-film magnetic heads.

Fourth Embodiment

Devices (semiconductor integrated circuit elements, liquid crystal display devices, etc.) are manufactured through an exposure process for exposing a substrate with the exposure apparatus according to the embodiment, a development process for developing the substrate exposed in the exposure process, and other known processes for processing the substrate developed in the development process, such as oxidation, deposition, doping, and etching.

While the present invention has been described with reference to exemplary embodiments, it is to be understood that the invention is not limited to the disclosed exemplary embodiments. The scope of the following claims is to be accorded the broadest interpretation so as to encompass all equivalent structures and functions.

This application claims the benefit of Japanese Application No. 2007-308968 filed Nov. 29, 2007, which is hereby incorporated by reference herein in its entirety.

What is claimed is:

1. A planar motor comprising:
    a movable body; and
    a stator configured to drive the movable body in a plane,
    wherein the stator includes a first stator unit and a second stator unit,
    wherein the movable body is moved in a first direction by a force acting between the movable body and the first stator unit, and is moved in a second direction by a force acting between the movable body and the second stator unit, and
    wherein the first stator unit and the second stator unit are arranged to face each other in such a manner that the movable body is provided therebetween.

2. The planar motor according to claim 1,
    wherein the movable body includes a first driving unit, and
    wherein the first driving unit and the first stator unit constitute a linear pulse motor.

3. The planar motor according to claim 2,
    wherein the movable body includes a second driving unit, and
    wherein the second driving unit and the second stator unit constitute a linear pulse motor.

4. The planar motor according to claim 3,
    wherein the first driving unit and the second stator unit include coils, and
    wherein the movable body is driven by passing current through the coils.

5. The planar motor according to claim 3,
    wherein the first stator unit and the second stator unit include coils, and
    wherein the movable body is driven by passing current through the coils.

6. The planar motor according to claim 3,
    wherein the first driving unit and the second driving unit include coils, and
    wherein the movable body is driven by passing current through the coils.

7. The planar motor according to claim 1, wherein the first direction and the second direction are orthogonal to each other.

8. A stage device comprising a planar motor,
    wherein the planar motor includes:
    a movable body on which a reticle or a wafer is mounted; and
    a stator configured to drive the movable body in a plane,
    wherein the stator includes a first stator unit and a second stator unit,
    wherein the movable body is moved in a first direction by a force acting between the movable body and the first stator unit, and is moved in a second direction by a force acting between the movable body and the second stator unit, and
    wherein the first stator unit and the second stator unit are arranged to face each other in such a manner that the movable body is provided therebetween.

9. An exposure apparatus configured to expose a wafer with a pattern of a reticle, comprising:
    a light source configured to emit light onto the reticle or the wafer; and
    a stage device including a planar motor,
    wherein the planar motor includes:
    a movable body on which the reticle or the wafer is mounted; and
    a stator configured to drive the movable body in a plane,
    wherein the stator includes a first stator unit and a second stator unit,
    wherein the movable body is moved in a first direction by a force acting between the movable body and the first stator unit, and is moved in a second direction by a force acting between the movable body and the second stator unit,
    wherein the first stator unit and the second stator unit are arranged to face each other in such a manner that the movable body is provided therebetween, and
    wherein the first stator unit has an opening, and the light is emitted from the light source onto the reticle or the wafer through the opening.

10. A device manufacturing method comprising the steps of:
    exposing a wafer with a pattern of a reticle by using an exposure apparatus; and
    developing the exposed wafer,
    wherein the exposure apparatus includes:
    a light source configured to emit light onto the reticle or the wafer; and
    a stage device including a planar motor,
    wherein the planar motor includes:
    a movable body on which the reticle or the wafer is mounted; and
    a stator configured to drive the movable body in a plane,
    wherein the stator includes a first stator unit and a second stator unit,
    wherein the movable body is moved in a first direction by a force acting between the movable body and the first stator unit, and is moved in a second direction by a force acting between the movable body and the second stator unit, wherein the first stator unit and the second stator unit are arranged to face each other in such a manner the movable body is provided therebetween, and wherein the first stator unit has an opening, and the light is emitted from the light source onto the reticle or the wafer through the opening.

* * * * *